United States Patent
Sugiyama et al.

[11] Patent Number: 6,049,898
[45] Date of Patent: Apr. 11, 2000

[54] FAILURE-DATA STORAGE SYSTEM

[75] Inventors: Yuji Sugiyama; Keiji Tanabe, both of Tokyo, Japan

[73] Assignee: Ando Electric Co., Ltd., Tokyo, Japan

[21] Appl. No.: 09/030,415

[22] Filed: Feb. 25, 1998

[30] Foreign Application Priority Data

Feb. 27, 1997 [JP] Japan .................................. 9-044333

[51] Int. Cl.⁷ .................................................. G06F 11/00
[52] U.S. Cl. .............................. 714/718; 714/724; 714/42
[58] Field of Search ................................ 714/7, 42, 718, 714/719, 720; 365/200, 201

[56] References Cited

U.S. PATENT DOCUMENTS

| | | | |
|---|---|---|---|
| 5,099,481 | 3/1992 | Miller ....................................... | 714/724 |
| 5,173,906 | 12/1992 | Dreibelbis et al. ...................... | 714/733 |
| 5,276,833 | 1/1994 | Auvinen et al. ......................... | 714/718 |
| 5,287,363 | 2/1994 | Wolf et al. ............................... | 714/718 |
| 5,384,533 | 1/1995 | Tokuda et al. ........................... | 714/724 |
| 5,530,805 | 6/1996 | Tanabe ..................................... | 714/42 |
| 5,535,353 | 7/1996 | Tanabe et al. ........................... | 714/718 |
| 5,561,671 | 10/1996 | Akiyama .................................. | 714/718 |
| 5,610,925 | 3/1997 | Takahashi ................................ | 714/724 |
| 5,623,595 | 4/1997 | Bailey ......................................... | 714/6 |
| 5,689,678 | 11/1997 | Stallmo et al. ......................... | 714/114 |
| 5,758,056 | 5/1998 | Barr .............................................. | 714/7 |
| 5,787,459 | 7/1998 | Stallmo et al. ......................... | 714/712 |

OTHER PUBLICATIONS

Microsoft Press Computer Dictionary, 1994.

Primary Examiner—Albert De Cady
Assistant Examiner—Guy Lamarre
Attorney, Agent, or Firm—Fish & Richardson P.C.

[57] ABSTRACT

A failure-data storage system is disclosed which is able to prepare data accumulated from a multiple data bit device test. Failure-data from the memory tester 1 is, before being stored in memory IC 6, logically added to one previous cycle failure-data with the same address by OR gate 12, and the result is input to F/F 13. The output of the F/F 13 is input to memory IC 6 when 3 state buffer 14 is in an enabled state and is fed back to the OR gate 12. Furthermore, each of the data bit of memory IC has data controller 10-1, 10-2, 10-3, and 10-4 as explained above.

2 Claims, 4 Drawing Sheets

001
FAILURE-DATA STORAGE SYSTEM

BACKGROUND OF THE INVENTION

1. Field of the Invention

The present invention relates to a failure-data storage system which is used for storing failure-data from a test of an IC (Integrated Circuit), such as a memory IC.

This application is based on patent application No. Hei 09-044333 filed in Japan, the content of which is incorporated herein by reference.

2. Description of Related Art

In Memory ICs, speed is increasing and capacity is also increasing as performance improves in devices having memory ICs built in. For example, 64 Mbit memory devices are in mass production and 256 Mbit memory devices are in prototype production. Furthermore, as the capacity of memory ICs increase, multiple data bit memory devices are becoming popular such as 8 bit or 16 bit. In tests of multiple data bit memory devices, an IC tester is equipped with a failure-data storage circuit for storing failure-data for analysis of the failure result.

A higher-performance failure-data storage system is required for testers for memory ICs with large capacity and multiple data bits. Therefore, a control circuit corresponding to the multiple data bit memory device is required for the failure-data storage circuit.

Memory devices are generally used in failure-data storage circuits to store failure-data of memory ICs. FIG. 3 shows a block diagram of a conventional control circuit in which memory device 60 with a 1 bit construction is used. According to FIG. 3, failure-data after a test are synchronized with a timing clock for the memory IC 60, and the resulting signal is input to the memory IC 60 as a write pulse: -WE. At the same time, a write address select signal is input from address select signal generator 54. Failure-data storage system 61 gives a plurality of accesses for the test to the same address of the device under test using a test pattern. In such a case, it is necessary to store the failure-data as accumulated data for each memory IC without erasing the previous data. Consequently, data input from the memory IC 60 is pulled up, and failure-data is input as a signal: -WE in FIG. 3. FIG. 4 is a timing chart representing the transitions of the signals in FIG. 3.

There is a problem in that the conventional failure-data storage system cannot independently control every bit of a multiple data bit device which is used as a failure-data memory. For this reason, failure-data for the same address is overwritten every time the test is done, and accumulated data cannot be stored.

SUMMARY OF THE INVENTION

It is therefore an object of the present invention to provide a failure-data storage system which is capable of accumulating data even for multiple data bit devices to store test results.

In order to attain this object, the present invention provides a failure-data storage system comprising an OR gate to add logically failure-data of the memory IC testing apparatus and output data of the memory IC which stores the failure-data; a flip-flop to store the output data of the above OR gate synchronized with the system clock; and a switch to provide an output of the above flip-flop to the memory IC synchronized with the write timing of the memory IC.

With the failure-data storage system of the present invention, the failure-data by the memory IC testing apparatus is logically added to the failure-data of the same address of a previous cycle, before it is stored in the memory IC. The added result is input to the flip-flop. The output of the flip-flop is input to the memory IC when the switch is in an enable state, and it is fed back to the OR gate.

DESCRIPTION OF PREFERRED EMBODIMENTS

Figure 1:
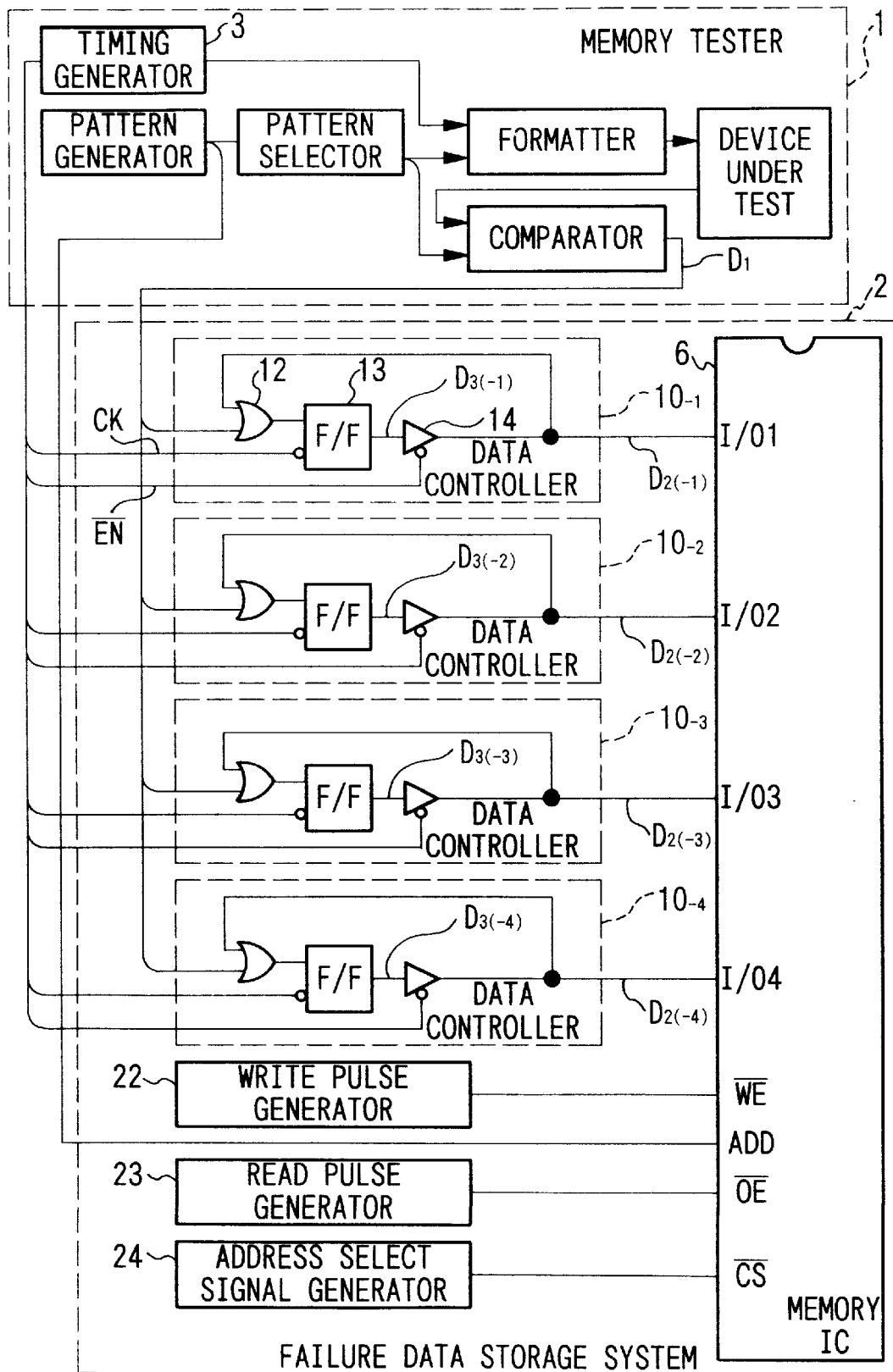
FIG. 1 is a block diagram illustrating the failure-data storage system according to an embodiment of the present invention.

Hereinbelow, a failure-data storage system according to an embodiment of the present invention will be described with reference to FIG. 1 which is a block diagram illustrating the failure-data storage system. In FIG. 1, memory IC 6 in the failure-data storage system 2 is a 4 bit system. Each bit stores failure-data output by the data controllers 10-1, 10-2, 10-3 and 10-4 (10-n corresponds to bit n of the memory IC, respectively) after the device test is finished.

The explanation of the data controller 10-1 will be given below as an example. OR gate 12 outputs the logical add operation of failure-data of the device test and failure-data stored in one previous cycle. Flip-flop(F/F) 13 latches the failure-data of the OR gate 12 when write signal: -WE is enabled. 3 state buffer 14 outputs the failure-data latched by the F/F 13 when the -WE is enabled. Each of the data controllers 10-2, 10-3 and 10-4 has the same construction as that of the of above 10-1.

Next, an explanation of the operation of the embodiment of the present invention explained in the above block diagram is given. Memory IC 6 has 4-bit input/output pins. As an example thereof, only a 1-bit example is explained below. Each of the other 3 bits has the same operation.

Failure-data originates from the device test in the memory tester 1, and the failure-data is transmitted to failure-data storage system 2 synchronized with the system clock which is an output of the timing generator 3. The failure-data which is stored in the memory IC 6 is read from I/O1 by designating the read signal: -OE and signal: -CS. The read out failure-data is input to the OR gate 12 which is contained in the data controller 10-1. The failure-data is logically added to the failure-data of the above device test, and the result is latched by F/F 13. Data controller 10-1 is in a READ mode before the failure-data explained above is latched by F/F 13. In this case, the output of 3 state buffer 14 is in a high-impedance state because the enable signal: -EN is 'H' which is an input to the 3 state buffer 14 in the data controller 10-1. That is to say, the data which is read out from memory IC 6 is led to the OR gate 12.

After the failure-data is latched by F/F 13, data controller 10-1 turns into a WRITE mode. The failure-data output by F/F 13 is input to memory IC 6 via 3 state buffer 14. The WRITE mode operation ends here, and the READ mode follows, which is explained above. These 2 modes then repeat alternately.

Figure 2:
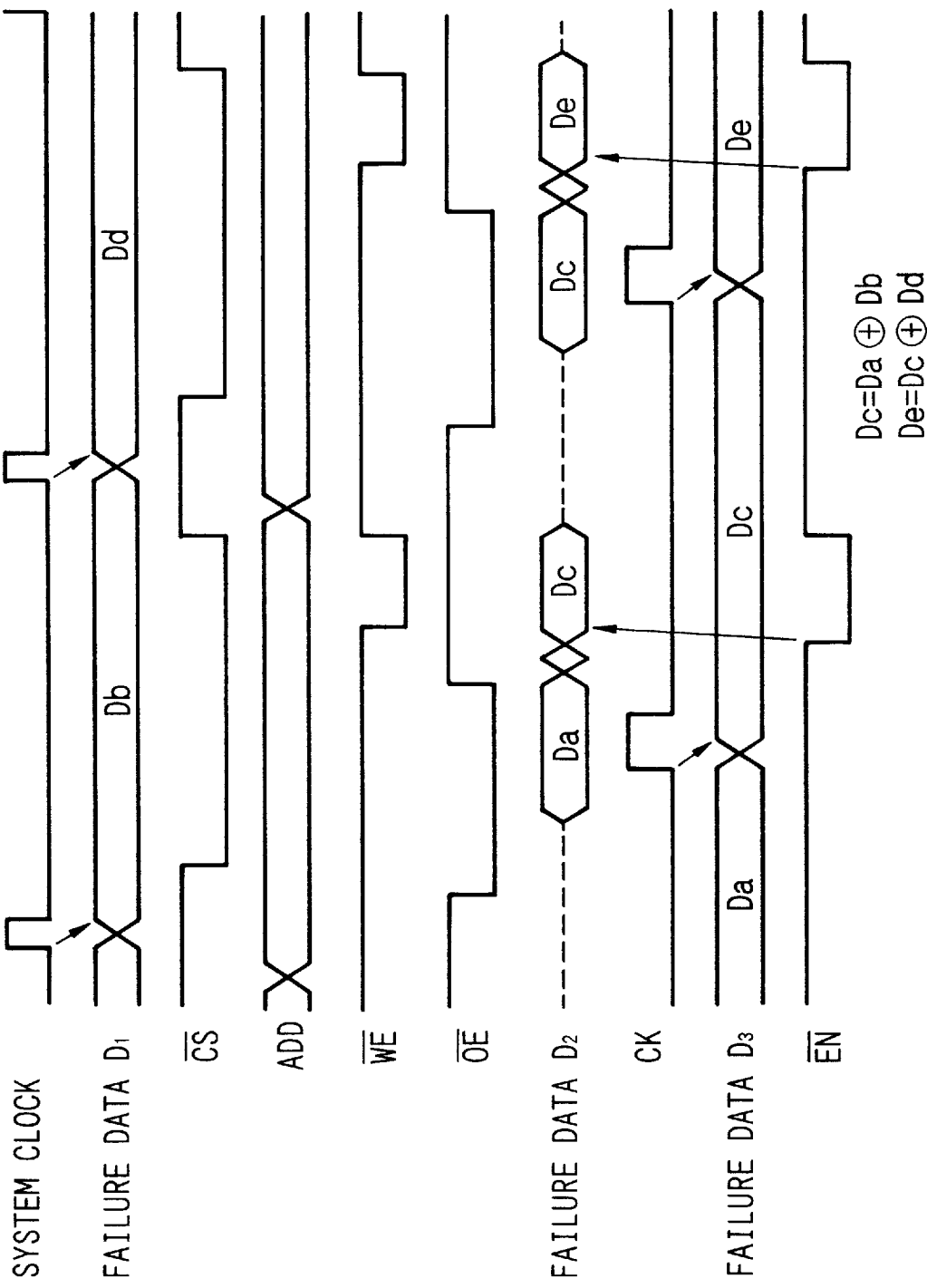
FIG. 2 is a timing chart showing the transitions of each signals.
Figure 3:
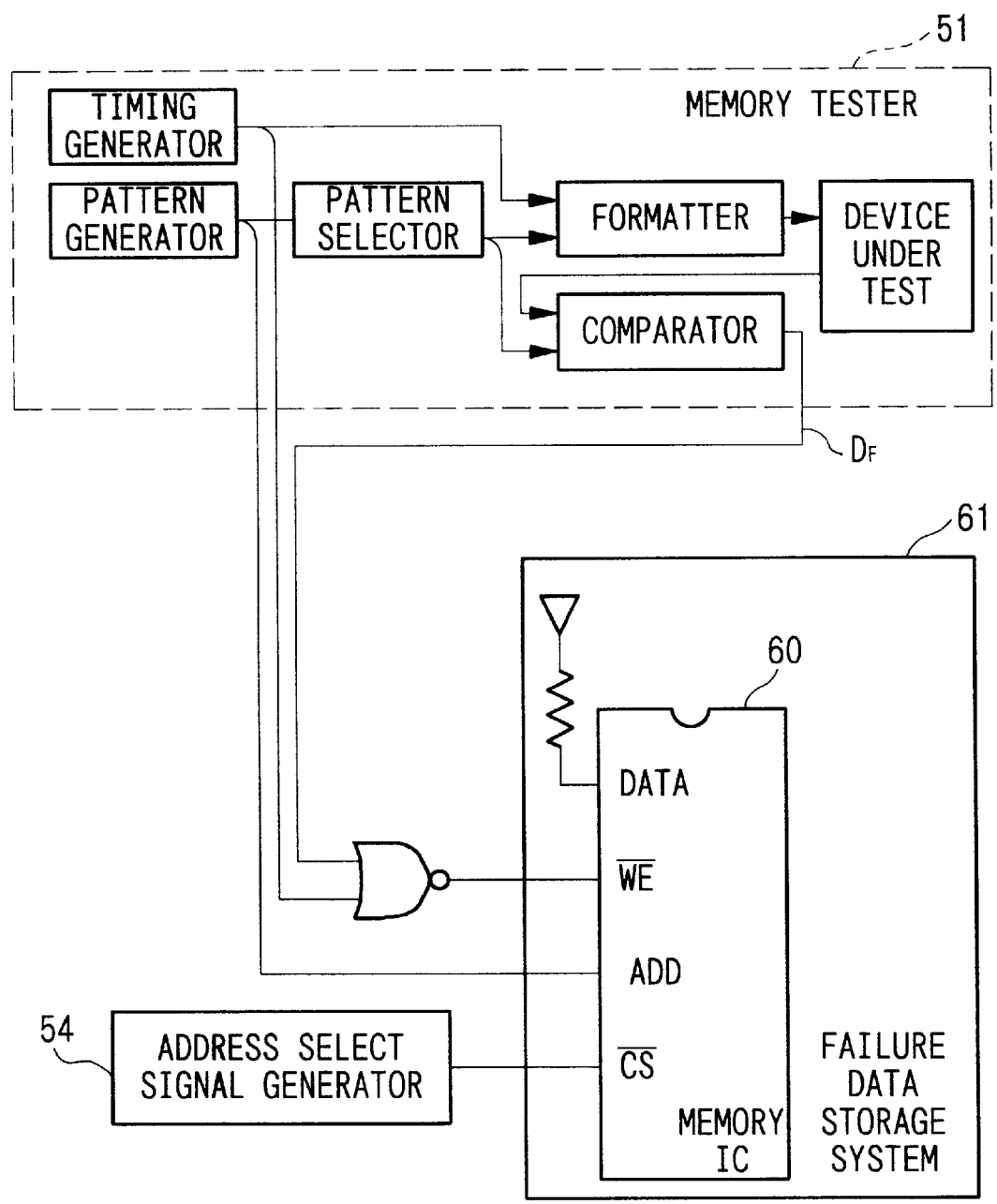
FIG. 3 is a block diagram of a conventional control circuit with a memory device with a 1 bit construction.
Figure 4:
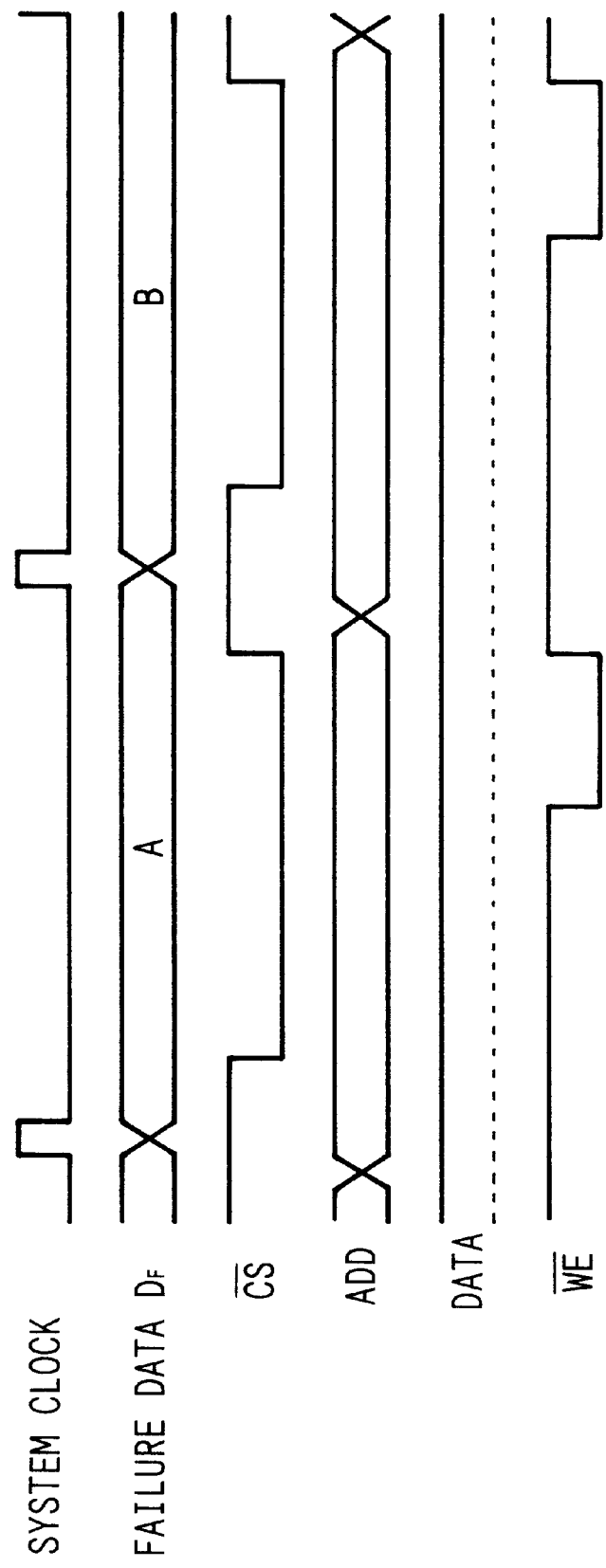
FIG. 4 is a timing chart of the transitions of each signal shown in FIG. 3.

FIG. 2 is a timing chart showing the transitions of each signal of FIG. 1. Failure-data D1 (refer to FIG. 1) is output to the data controller 10-1 with a constant period synchronized with a system clock. Memory IC 6 turns into a READ mode by read-out signal: -OE turning to 'L'. In this mode, signal: ADD is read at the timing of signal: -CS falls (by trailing edge). Failure-data D1 is logically added to failure-data D2 (refer to FIG. 1) at the OR gate 12. The output of OR gate 12 is input to F/F 13, and latched by the clock signal CK (refer to FIG. 1). After this latch operation, the WRITE mode starts in which the write signal: -WE is enabled and read signal: -OE is disabled.

Enable signal: -EN which is input to the 3 state buffer 14 turns to 'L' in the WRITE mode. Consequently, bit 1 of the failure-data output by F/F 13 is input to I/O1 of the memory IC 6. As explained above, the embodiment of the present invention has an operation of READ/WRITE to the same address of the memory IC which stores the failure-data. In this way, the previous data is always referred to and the contents is maintained. In other words, once an item of failure-data is detected at a certain address in a test, the item remains even if the failure-data passes at another address, and it is stored as accumulated failure-data in the failure-data storage system.

In addition, the above mentioned F/F is used as a temporary storage, and it can be replaced by other storage devices such as latches. Also, the above mentioned 3 state buffer turns on/off according to the read or write timing of the memory IC, and it can be replaced by other devices such as switches.

Furthermore, the organization of the memory tester, etc., and so on shown above is only an example, and the present invention in not restricted by this example.

According to the above embodiment of the present invention, the failure-data by the IC test is logically added, before it is stored in a memory IC, to the failure-data of one previous cycle with an OR gate, and the result is input to the F/F. Consequently, the output of the F/F is input to the memory IC when the switch is in an enabled state, and it is then fed back to the OR gate. Accordingly, it is possible for a failure-data storage system to prepare accumulated data even for a multiple data bit device test. Furthermore, it is possible to control every bit of the memory IC, and failure-data of the tested device is accumulated because data controllers are arranged for every bit of the memory IC.

What is claimed is:

1. A failure-data storage system comprising:

an OR gate to add logically failure-data of a memory IC testing apparatus and output data of a memory IC storing the failure-data;

a flip-flop to store output data of said OR gate synchronized with a system clock;

a switch to provide an output of the flip-flop to the memory IC synchronized with write timing of the memory IC.

2. The failure-data storage system according to claim 1, wherein said OR gate, said flip-flop, and said switch comprise a data controller which holds failure-data to be stored in said memory IC; and said data controller is prepared for every bit of said memory IC.

* * * * *